United States Patent [19]

Ishizawa et al.

[11] Patent Number: 4,937,441
[45] Date of Patent: Jun. 26, 1990

[54] DIAGNOSIS APPARATUS FOR PHOTO COUPLER AND PHOTO COUPLER DEVICE WITH DIAGNOSIS FUNCTION

[75] Inventors: Hiroaki Ishizawa; Hideki Asai; Takehide Sato, all of Katsuta, Japan

[73] Assignee: Hitachi, Ltd., Tokyo, Japan

[21] Appl. No.: 264,038

[22] Filed: Oct. 28, 1988

[30] Foreign Application Priority Data

Oct. 30, 1987 [JP] Japan ............................. 62-275114

[51] Int. Cl.⁵ .............................................. G01J 1/32
[52] U.S. Cl. .................................. 250/205; 250/214 R
[58] Field of Search ............ 250/205, 214 R, 214 SW, 250/551; 315/149, 151, 158

[56] References Cited

U.S. PATENT DOCUMENTS

| | | | |
|---|---|---|---|
| 3,919,546 | 11/1975 | Lutus | 250/205 |
| 4,733,398 | 3/1988 | Shibagaki et al. | 250/205 |
| 4,757,191 | 7/1988 | Shimada et al. | 250/205 |

FOREIGN PATENT DOCUMENTS

| | | |
|---|---|---|
| 2603634 | 8/1978 | Fed. Rep. of Germany . |
| 2614359 | 8/1978 | Fed. Rep. of Germany . |
| 2823832 | 12/1978 | Fed. Rep. of Germany . |
| 2730056 | 1/1979 | Fed. Rep. of Germany . |
| 3321921 | 9/1986 | Fed. Rep. of Germany . |
| 3518262 | 11/1988 | Fed. Rep. of Germany . |
| 2141228 | 6/1984 | United Kingdom . |

OTHER PUBLICATIONS

Mikrowellen Messtechnik, 1969, pp. 324-329.
"Series of Photo-Electric Elements", Catalog published by Omron Co., pp. 4-7, 10-11, 14-15.

Primary Examiner—David C. Nelms
Assistant Examiner—Stephone B. Allen
Attorney, Agent, or Firm—Fay, Sharpe, Beall, Fagan, Minnich & McKee

[57] ABSTRACT

A diagnosis apparatus for a photo coupler having at least one photo coupler including a light emitting element the amount of light emitted from which changes in accordance with the value of a current flowing therethrough and a light receiving element which receives the light from the light emitting element to convert it into an electric signal corresponding to the received amount of light, a checking current setting circuit for setting a current flowing through the light emitting element to a current value for checking, a level detecting circuit for controlling a current flowing through the light emitting element on the basis of the current value set by the checking current setting circuit, a reference signal generator for generating a reference signal, a comparing and detecting circuit for comparing the electric signal from the light receiving element with the reference signal and detecting the deterioration of a function of the photo coupler on the basis of the result of comparison.

16 Claims, 6 Drawing Sheets

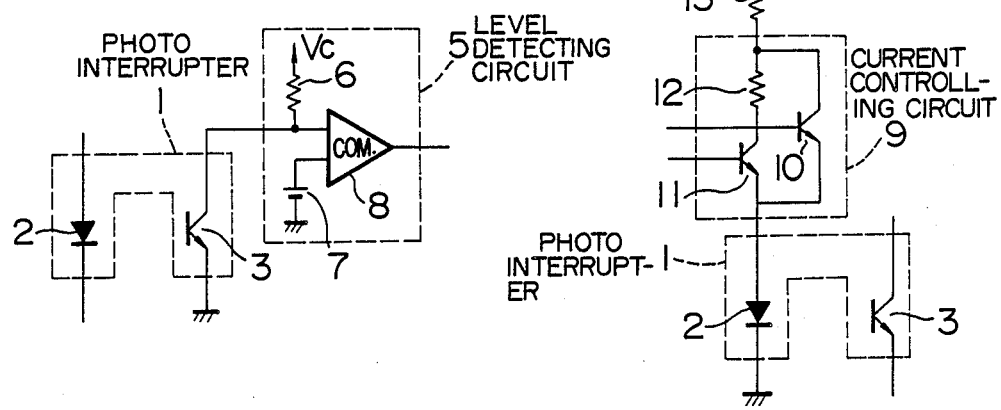
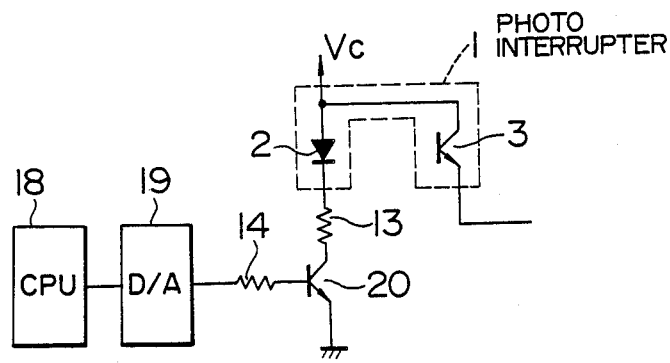
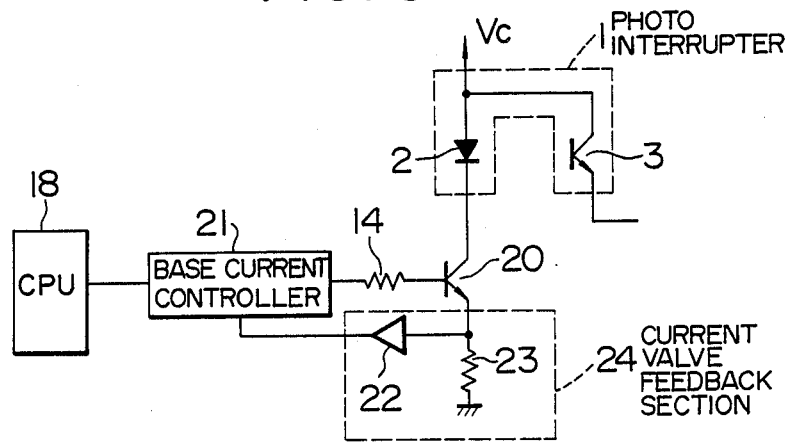

DIAGNOSIS APPARATUS FOR PHOTO COUPLER AND PHOTO COUPLER DEVICE WITH DIAGNOSIS FUNCTION

BACKGROUND OF THE INVENTION

The present invention relates to a diagnosis apparatus for a photo coupler and a photo coupler device with diagnosis function, and more particularly to an apparatus which is capable of diagnosing the deterioration in the function of a photo coupler the light receiving surface of which is liable to be stained by chemicals or the like as in an automatic chemical analysis apparatus.

A typical conventional position detector utilizes a photo coupler such as a photo interrupter in which a light emitting diode and a photo transistor are used as a light emitting element and a light receiving element respectively and light proceeding from the light emitting diode to the photo transistor is interrupted by a detector plate interlocking with a moving body or passed to the photo transistor. Such a photo coupler is disclosed by, for example, the catalog "Series of Photo-Electric Elements" published by Omron Company. A sufficient current always flows through the light emitting diode so as to allow the incidence of light capable of sufficiently saturating the photo transistor, and light from the light emitting diode is interrupted by the detector plate or passed, thereby changing the impedance of the photo transistor to turn the photo transistor on or off. Whether or not the detector plate is in a light interrupting position can be detected on the basis of the ON/OFF output of the photo transistor.

The above-mentioned catalog also discloses a photo coupler using a reflection type of detector plate. In this photo coupler, light from a light emitting diode is reflected by the detector plate and the reflected light is brought onto a photo transistor. A sufficient current is always flown through the light emitting diode so as to sufficiently saturate the photo transistor by the reflected light from the detector plate, and light from the light emitting diode is reflected by the detector plate or passed, thereby turning the phototransistor on or off. Whether or not the detector plate is in a light reflecting position can be detected on the basis of the ON/OFF output of the photo transistor.

In the case where the light emitting diode and the photo transistor are connected in series with each other, a light-activated positive feedback is produced during incidence of light from the light emitting diode upon the photo transistor so that the photo transistor is turned on or a current becomes liable to flow through the photo transistor with the result that a sufficient current continues flowing through the light emitting diode connected in series with the photo diode and hence the photo transistor continues producing its ON output. If, when the photo coupler is in such a state, the detector plate comes to a position at which light from the light emitting diode is not incident upon the photo transistor the photo transistor assumes its Off condition so that a current flowing through the photo transistor becomes approximately zero and hence a current flowing through the light emitting diode connected in series with the photo transistor correspondingly decreases. Thus, the output of the photo transistor is changed in accordance with the position of the detector plate in such a manner that when the light from the light emitting diode does not impinge upon the photo transistor in dependence on the position of the detector plate, a current flowing through the light emitting diode is decreased, thereby reducing the amount of light.

In the above-mentioned prior art, a constant current with which the light emitting diode emits light capable of sufficiently saturating the photo transistor may always flows through the light emitting diode. For the photo coupler in which the light emitting diode and the photo transistor are connected so that the light-activated positive feedback is provided, a current flowing through the light emitting diode when light from the light emitting diode impinges upon the photo transistor is brought to a value with which the light emitting diode emits light capable of sufficiently saturating the photo transistor while the current of the light emitting diode when the light from the light emitting diode does not impinge upon the photo transistor is selected to have the minimum value with which the positive feedback is properly induced upon a point of time when the light enters the photo transistor again. However, no consideration is paid to any deterioration attendant upon the lapse of time including the decrease of the amount of light emitted from the light emitting diode at the same current, the deterioration of a detection level of the photo transistor, and the decrease of the amount of light incident upon the photo transistor resulting from stains on the light emitting surface of the light emitting diode, the light receiving surface of the photo transistor and the light reflecting surface of the reflection type of detector plate by chemicals or the like. Therefore, when such a deterioration gradually progresses, the progression of the deterioration cannot be detected until the deterioration reaches a level at which the detection of a position of the detector plate is impossible and the system becomes inoperative. In a system such as an automatic analysis apparatus using a multiplicity of (50 to 100) photo interrupters, a great problem is how to reduce the rate of inferior photo interrupters, thereby improving the reliability. In the case of a system using many chemicals as in biochemistry, there is a problem that the photo interrupter is liable to be stained with a decreased amount of light incident upon the light receiving element, thereby resulting in frequent troubles due to the inferiority of the photo interrupter.

SUMMARY OF THE INVENTION

A first object of the present invention is to provide a self-diagnosis function capable of detecting a tolerance for the deterioration of a detection level of a photo coupler such as a photo interrupter due to the decrease of the amount of light emitted from a light emitting element, the deterioration of a detection level of a light receiving element, stains on the light emitting surface of the light emitting element, stains on the light receiving element and stains on the light reflecting surface of a reflection type of detector plate, so that the rate of inferiority of the photo coupler is decreased by the self-diagnosis to improve the reliability.

A second object of the present invention is to provide a system with a plurality of photo couplers such as photo interrupters in which self-diagnosis functions are provided to all of the photo couplers so that the self-diagnosis is automatically made to prevent the system from stopping due to the abnormality of the photo coupler(s), thereby improving the reliability of the whole system.

According to the present invention, there are provided a diagnosis apparatus for a photo coupler and a photo coupler device with diagnosis function which comprises at least one photo coupler including a light emitting element the amount of light emitted from which changes in accordance with the value of a current flowing therethrough and a light receiving element which receives the light from the light emitting element to convert it into an electric signal corresponding to the received amount of light, current setting means for setting a current flowing through the light emitting element to a current value for checking, a level detecting circuit for controlling a current flowing through the light emitting element on the basis of the current value set by the current setting means, means for generating a reference signal, and detecting means for comparing the electric signal from the light receiving element with the reference signal and detecting the deterioration of a function of the photo coupler on the basis of the result of comparison.

BRIEF DESCRIPTION OF THE DRAWINGS

FIGS. 1B, 1C, 2 and 3 show various modifications to the circuit shown in FIG. 1A;

FIG. 4 is a circuit diagram showing an example in which a current setting is made by use of a D/A converter circuit;

FIG. 5 is a circuit diagram showing an example in which a current setting is made by use of a feedback circuit;

DESCRIPTION OF THE PREFERRED EMBODIMENTS

Embodiments of the present invention will now be explained in reference to the accompanying drawings.

Figure 1A:
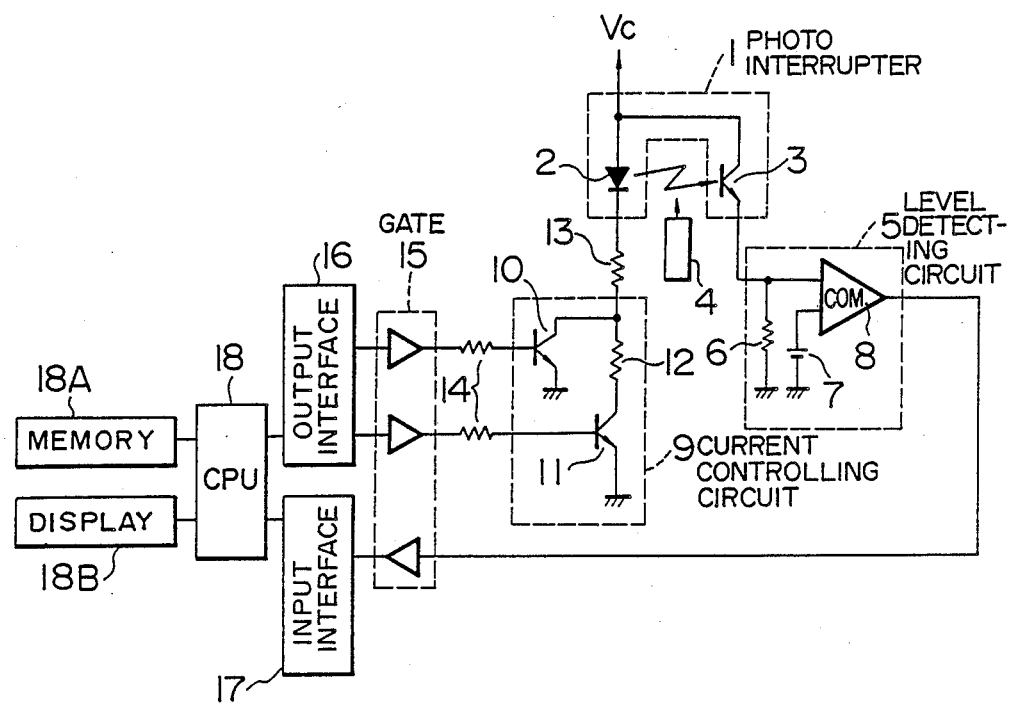
FIG. 1A is a circuit diagram showing an embodiment of the present invention.

FIG. 1A is a circuit block diagram of an embodiment of the present invention. In a photo coupler such as a photo interrupter 1 including a light emitting element 2 such as a light emitting diode and a light receiving element 3 such as a photo transistor in combination, an output of the light receiving element 3 is taken out by a current-to-voltage conversion resistor 6 as a voltage representative of a current change corresponding to the amount of light incident upon the light receiving element 3. This voltage and a reference voltage 7 are compared with each other by a comparator 8 which in turn produces a digital signal including ON and OFF levels. The digital or ON/OFF signal is inputted to a CPU 18 (as emitted-light amount setting means and abnormality detecting means) through a gate 15 and an input interface 17. A memory 18A and a display 18B are connected to the CPU 18. If the optical axis of the light emitting element 2 and the optical axis of the light receiving element 3 are aligned with each other with a physical space provided between the light emitting element 2 and the light receiving element 3 and a detector plate 4 intercepting light is arranged so that it goes in and out of the physical space, the ON/OFF digital signal depending on the amount of light incident upon the light receiving element 3 can be used as a signal for discriminating whether the detector plate 4 is at a position on the optical axis or at a position out of the optical axis. For such a position detection, a current controlling circuit 9 and a resistor 13 having a value with which a rated current for causing the light emitting element 2 to emit light capable of sufficiently saturating the light receiving element 3 at an initial normal condition are connected to a line for power supply to the light emitting element 2. The current controlling circuit 9 is designed such that a current flowing through the light emitting element 2 can be set to an initial (or initialized) rated value, a value of about zero, and a value slightly smaller than the initial rated value. The initial rated value is a current value based upon usual use or operation of the photo interrupter 1 or a current value with which, at an initial normal condition of the photo interrupter 1 and when the detector plate 4 is at a position at which light from the light emitting element 2 impinges upon the light receiving element 3, the light emitting element 2 emits the amount of light with which the light receiving element 3 can be sufficiently saturated and the light receiving element 3 has an output value making it possible to detect with a sufficient tolerance that the detector plate 4 is at the position at which the light from the light emitting element 2 is incident upon the light receiving element 3. The value of about zero is zero or a small current value with which the light emitting element 2 only emits the amount of light to which the light receiving element 3 is not sensitive. The value slightly smaller than the initial rated value is a current value of the light emitting element 2 when the amount of light from the light emitting element 2 is reduced until, if the photo interrupter 1 is deteriorated, the output level of the light receiving element 3 assumes a level at which the condition of non-incidence of light upon the light receiving element 3 will be detected even if the light emitting element 2 is energized with the initial rated current value.

By making it possible to change the current value of the light emitting element 2 as mentioned above, the progression of any deterioration of the photo interrupter 1 due to stains or the like can be judged before the system becomes entirely inoperative and hence the stoppage of the system in which will otherwise result can be prevented by effecting a necessary maintenance. The current controlling circuit 9 includes a parallel connection of a transistor 10 for rated current connected directly to the resistor 13 and a transistor 11 for check current connected to the resistor 13 through a resistor 12 provided for supplying a reduced current for checking. The bases of the transistors 10 and 11 are connected to input resistors 14 each of which has a value selected to provide a base current necessary for sufficiently saturating the transistor 10 or 11 to turn it on when an output of the gate 15 is in a high level. The CPU 18 determines the high or low level of the output of the gate 15 through an output interface 16 to determine how to turn on or off each of the transistors 10 for rated current and the transistor 11 for check current.

When the transistor 10 for rated current is turned on, a current I flows from a power source of voltage $V_C$ to the ground (GND) through the light emitting element 2 and the resistor 13. Provided that a voltage drop at the light emitting element 2, a voltage drop at the transistor 10 for rated current and the value of the resistor 13 are $V_L$, $V_{T10}$ and $R_{13}$ respectively, the current 1 is represented by.

$$I = \frac{V_C - V_{T10} - V_L}{R_{13}}.$$

Provided that a voltage drop at the light receiving element 3 upon a normal operation in which the light emitting element 2 is energized or excited into illumination with such a current I is $V_D$, an input voltage to the comparator 8 is $V_C - V_D$ under a light or bright condition and about zero under a dark condition. Therefore, in order that the light or dark condition, that is whether or not the detector plate 4 is at the light intercepting position is converted into the ON/OFF output of the comparator 8, the value $V_{ref}$ the reference voltage 7 is set to be about $(V_C - V_D)/2$, taking noise margin, tolerance and so on into consideration. Usually, $V_{ref}$ is set to about 2.2 V since $V_C$ is 5 V and $V_D$ is about 0.6 V.

However, even if the detector plate 4 is at a position at which it does not intercept light from the light emitting element 2, the input voltage to the comparator 8 may be lowered due to the decrease of the amount of light emitted from the light emitting element 2, the increase of $V_D$ resulting from the deterioration of the light receiving element 3, the decrease of the amount of light resulting from stains on the light emitting surface of the light emitting element 2 or the light receiving surface of the light receiving element 3 or the like. If the input voltage to the comparator 8 ultimately is lowered to a value not larger than $V_{ref}$, the detection of a position of the detector plate 4 becomes impossible. Accordingly, at any time before there results in such a situation and when a normal operation is possible, the transistor 10 for rated current is turned off and the transistor 11 for check current is turned on so that the current of the light emitting element 2 is reduced to a value of $$I = \frac{V_C - V_{T11} - V_L}{R_{13} + R_{12}}.$$

($V_{T11}$ being a voltage drop at the transistor 11 for check current and approximately equal to $V_{T10}$, and $R_{12}$ being the value of the resistor 12), thereby lowering the amount of light emitted from the light emitting element 2 to increase $V_D$ and hence to lower the value of the input voltage of the comparator 8. In this case, if the deterioration of the photo interrupter 1 is so severe that the input voltage of the comparator 8 becomes lower than $V_{ref}$, the lack of tolerance due to the deterioration can be judged by the output of the comparator 8. On the other hand, if the input voltage of the comparator 8 is higher than $V_{ref}$, the output of the comparator 8 judges the tolerance to be still existent.

In the case where both the transistor 10 and the transistor 11 are turned off, no current flows through the light emitting element 2 and hence the light receiving element 3 is to be turned off. Therefore, the existence of any trouble of the light receiving element side in a short mode can be also discriminated.

Figure 1B:
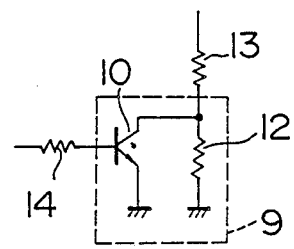

If the discrimination of the short mode is not necessary, the transistor 11 is omitted and the resistor 12 is grounded, as shown in FIG.1B. In that case, the lack of tolerance can be discriminated by the ON/OFF of the transistor 10.

Figure 1C:
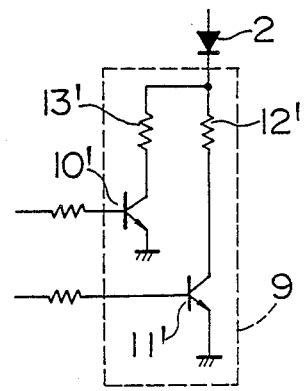

The current controlling circuit 9 may take a construction, as shown in FIG. 1C, in which a series circuit of a transistor 10' and a resistor 13' and a series circuit of a transistor 11' and a resistor 12' are connected in parallel to each other. In that case, when the transistors 10' and 11' are both turned on, a rated current flows through the light emitting element 2. If the transistors 10' and 11' are both turned off, the discrimination of the short mode is possible. If only the transistor 10' is turned on, a current equal to two-thirds of the rated current flows through the light emitting element 2. If only the transistor 11' is turned on, a current equal to one third of the rated current flows through the light emitting element 2. In the case where only the transistor 11' is turned on, a relatively large tolerance can be checked, if an abnormality is detected by this check, it is possible to know that a repair is required in a few days. If an abnormality is detected in the case where only the transistor 10' is turned on, it is possible to know that an urgent repair is necessary.

Various changes may be made to the circuit shown in FIG. 1A. For example, a similar effect can be obtained even if an output terminal of the light receiving element 3 is changed as shown in FIG. 2. In that case, the resistor 6 in the level detecting circuit (comparing means) 5 is connected to $V_C$. Further, a similar effect can be obtained even if the connection of the light emitting element 2 and the current controlling circuit 9 to each other is reversed.

FIG. 4 shows an example in which the current controlling circuit 9 is constructed by a D/A converter 19 and a current controlling transistor 20. With such a construction, an effect similar to that mentioned above can be obtained by producing a base current necessary for saturation of the current controlling transistor 20 by the D/A converter 19 at a usual operation while lowering the base current to a value necessary for checking at a checking operation.

The control or setting to a current at a usual operation and a current at a checking operation can be also realized by a construction, as shown in FIG. 5, in which there is provided a current value feedback section 24 composed of a resistor 23 for monitoring a current flowing through the light emitting element 2 and a current value feedback circuit 22 for amplifying the monitored current and an output of the current value feedback section 24 is fed back to a base current controller 21.

Figure 6:
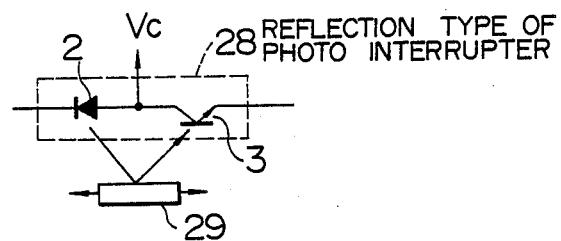
FIG. 6 is a view showing an example of the case where a reflection type of detector plate is used.
Figure 7:
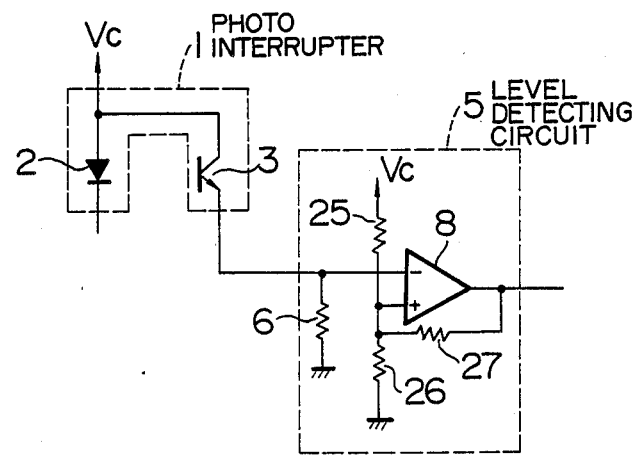
FIG. 7 is a circuit diagram showing another example of a level detecting circuit.

The transistors 10, 11, 10', 11' and 20 may be FET's. The position detector may be a reflection type of photo interrupter 28, as shown in FIG. 6, in which light emitted from the light emitting element 2 is reflected by a reflection type of detector plate 29 and the reflected light is made incident upon the light receiving element 3. As shown in FIG. 7, the reference voltage of the level detecting circuit 5 may be produced by dividing the power source voltage $V_C$ by resistors 25 and 26 and a hysteresis characteristic can be provided to the level detecting circuit 5 by a hysteresis resistor 27.

Figure 8:
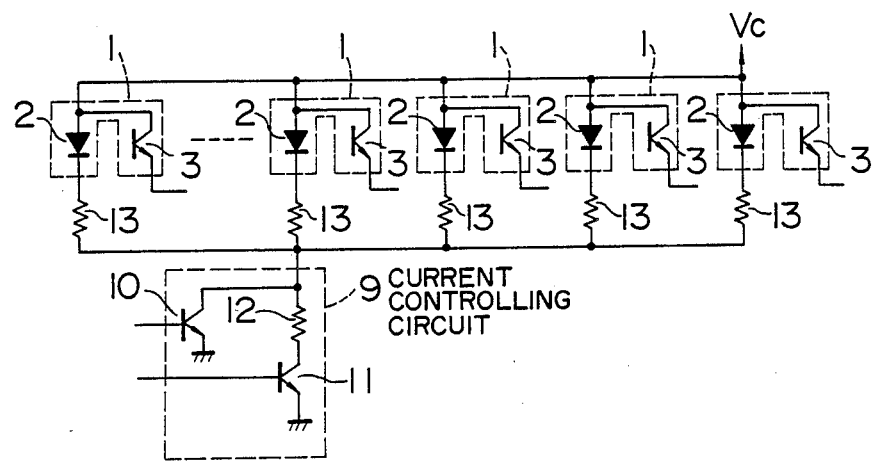
FIGS. 8, 9 and 10 are circuit diagrams showing different examples of connection in the case where a multiplicity of photo couplers are used.

FIG. 8 shows an example of connection in the case where a multiplicity of photo interrupters are used. In the shown example, light emitting elements 2 in a plurality of parallel-connected photo interrupters 1 are simultaneously controlled by a current controlling circuit 9 in a single power source system, thereby reducing the number of circuits required and simplifying a control operation. Such a construction has an effect that the checking of the plurality of photo interrupters 1 can be simply made.

Figure 9:
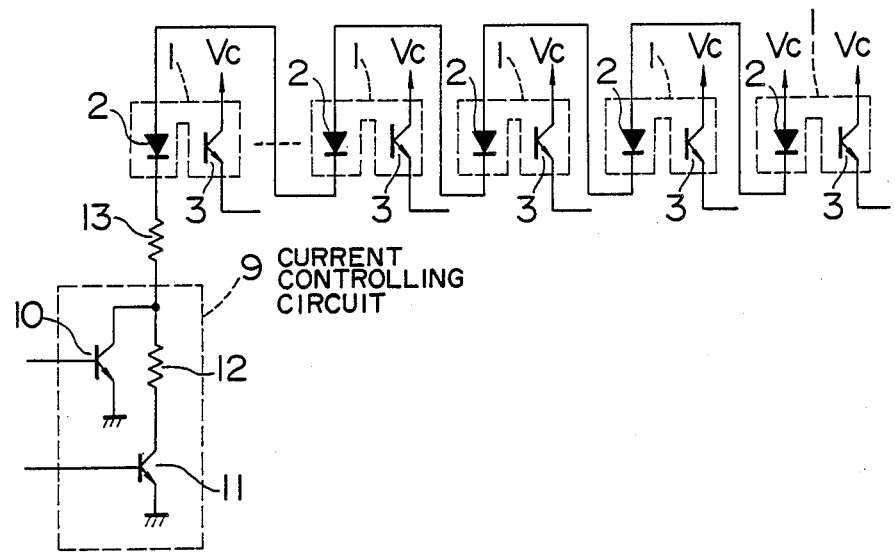

The light emitting elements 2 may be connected in series with each other, as shown in FIG. 9. In that case, only one resistor 13 suffices. Further, there is an effect that the same current flows through all of the light emitting elements 2. Also, in the case where the construction shown in FIG. 9 is used in a system in which the plurality of photo interrupters 1 are disposed in a concentrated manner, there is an effect that only two wirings are required for the light emitting elements 2 irrespective of the number of the photo interrupters.

Figure 10:
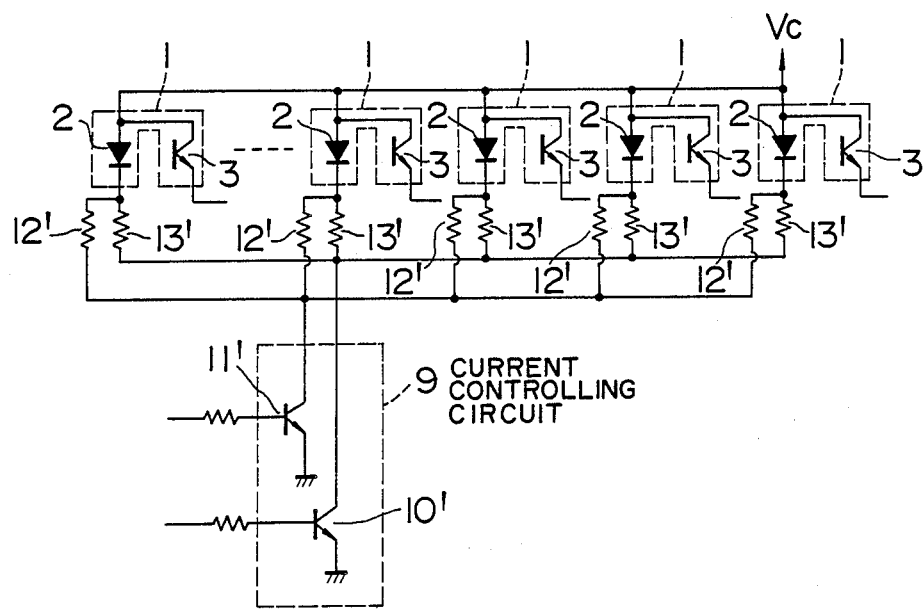

FIG. 10 shows a circuit in which a multiplicity of parallel-connected photo interrupters are operated by use of the current controlling circuit 9 shown in FIG. 1C.

In each of the circuits shown in FIGS. 8 to 10, emitter circuits of the light receiving elements 3 in the photo interrupters are connected to the CPU 18 through the respective level detecting circuits 5 and the input interface 17, as shown in FIG. 1A. Therefore, the CPU 18 can discriminate which one of the photo interrupters has a trouble.

Figure 11:
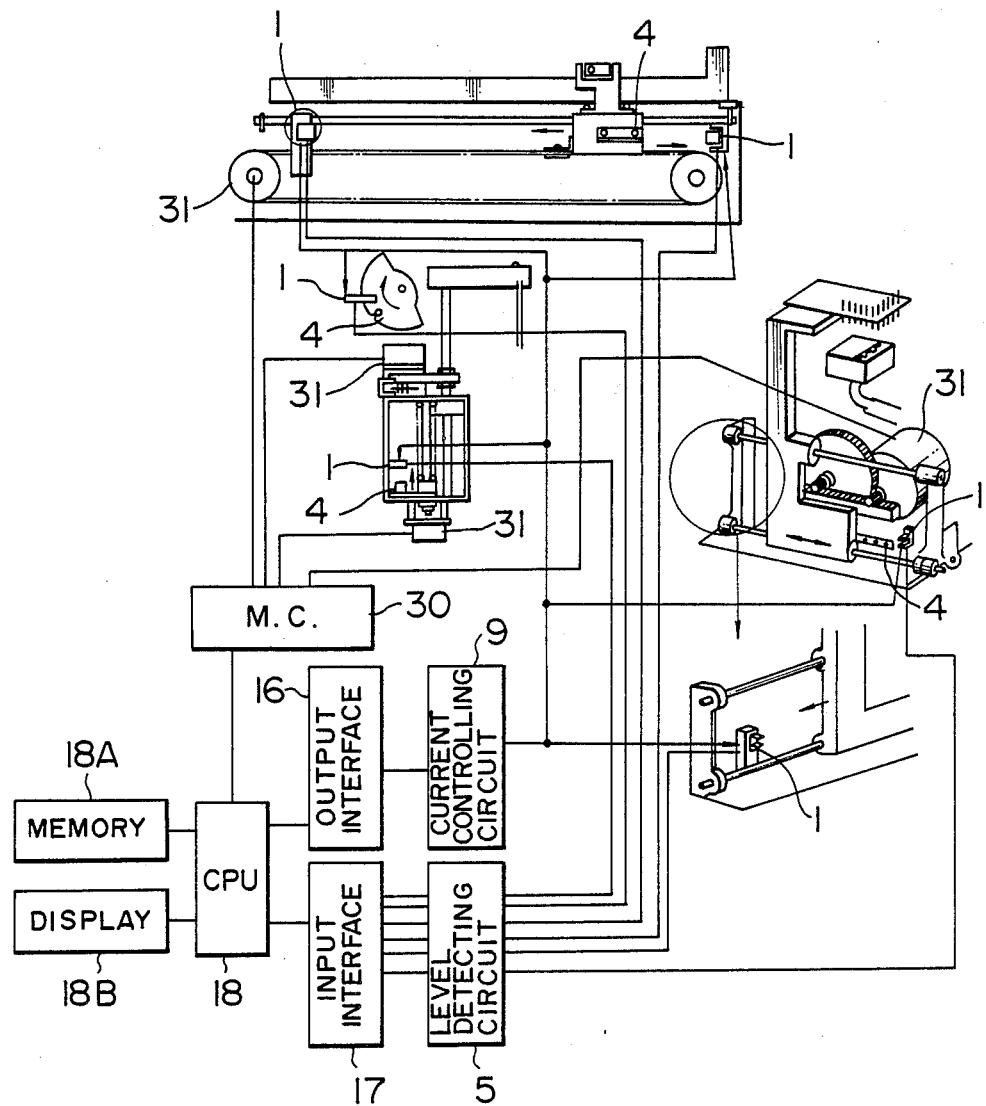
FIG. 11 is a schematic view showing the construction of the whole of a system according to an example of the case in which the present invention is applied to an automatic chemical analysis apparatus.

FIG. 11 shows a system in which photo interrupters 1 are arranged at various locations in an automatic chemical analysis apparatus and each of detector plates 4 is moved by an actuator composed of the combination of a motor 31 and a motor controller (M.C.) 30. In the system, a CPU 18 issues a command to the motor controller 30 in accordance with a program stored in a memory 18A. Each motor 31 is controlled by the motor controller 30 to move the corresponding detector plate 4. Each photo interrupter 1 detects the movement of the corresponding detector plate 4 until a predetermined position to send a detection signal to the CPU 18 through a level detecting circuit 5 and an input interface 17. The CPU detects the sent detection signal to issue a command for stoppage of the corresponding detector plate etc.

In the present invention, a program for checking of the photo interrupters is stored in the memory 18A. Explanation of an operation following the photo interrupter checking program will now be made by virtue of FIGS. 11 and 12.

The CPU 18 starts the photo interrupter checking program upon throw-in of a power or upon execution of a specified instruction. First, the CPU 18 supplies rated currents to the light emitting elements in all of the photo interrupters 1 through an output interface 16 (at step 41) and checkes the state or condition of the light receiving element in each photo interrupter 1 through the input interface 17 (at step 42). At step 43, there is made the judgement of whether or not all of the photo interrupters 1 are in their light receiving conditions. If the judgement at step 43 is NO, the detector plate corresponding to the photo interrupter which is not in a light receiving condition is driven by the motor controller 30 and the corresponding motor 31 to bring it into a light receiving condition (at step 44). On the other hand, if the judgement at step 43 is YES, step 44 is skipped since all of the light receiving elements are in their light receiving conditions.

Next, a checking current smaller than the rated current is supplied to each light emitting element (at step 45) and there is made the checking of whether each light receiving element could detect a light receiving condition (at step 46). Whether or not all of the photo interrupters are normal is judged at step 47 in accordance with the result of checking at step 46. If the judgement at step 47 is YES, 'normal' is displayed on a display 18B at step 48, thereby terminating the execution of the photo interrupter checking program. On the other hand, if the judgement at step 47 is NO, the identification number of an abnormal photo interrupter is stored into the memory 18A at step 49 and the presence of the abnormal photo interrupter and the identification number thereof are displayed on the display 18B at step 50, thereby terminating the execution of the program.

An alarm device such as a buzzer or a lamp may be used in place of the display 18B. In that case, an alarm is issued at step 50 when an abnormal photo interrupter is present.

As has been mentioned above, the tolerance of the photo interrupter 1 can be self-checked prior to the use of the system. As a result, the reliability of the system can be improved. Also, since the display or alarm concerning the lack of tolerance is made before the system becomes inoperative, a proper maintenance can be made, thereby avoiding the system-down resulting from the inferiority of the photo interrupter 1 due to the deterioration of a detection level.

In the foregoing embodiments, since the reduction of the tolerance of a detection level of the photo interrupter can be discriminated before the detection level is deteriorated to an extent that the photo interrupter becomes inoperative, it is possible to know the necessity of maintenance during a time when the system is operative. As a result, there can be avoided an inconvenience that the detection level of the photo interrupter 1 is deteriorated to an extent that the photo interrupter becomes inoperative.

Figure 12:
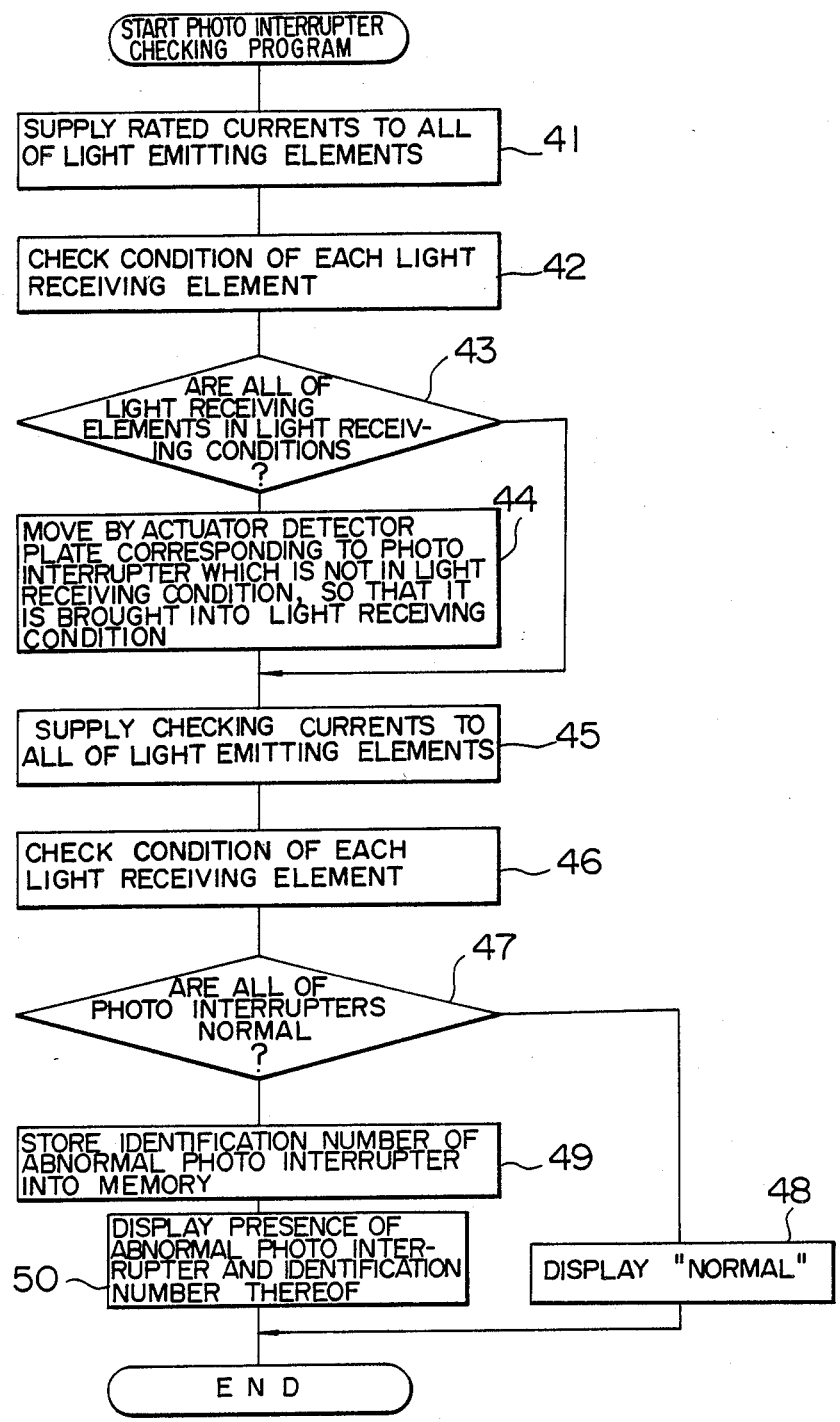
FIG. 12 is a flow chart showing the procedure of diagnosis according to the present invention.

The foregoing explanation has been made in conjunction with the diagnosis of a photo interrupter. However, the present invention is also applicable to a photo coupler which does not use the detector plate, for example, a photo coupler in which light modulated at the light emitting element side is received by a light receiving element to be converted into an electric signal. In that case, steps 41 to 44 in the flow chart shown in FIG. 12 are omitted and the diagnosis of the photo coupler is made by performing steps 45 to 50.

We claim:

1. A diagnosis apparatus for a photo coupler
   including a light emitting element the amount of light emitted from which changes in accordance with the value of a current flowing therethrough and a light receiving element which receives the light from the light emitting element and converts it into an electric signal corresponding to the received amount of light, the diagnosis apparatus comprising:
   current setting means for setting a current flowing through said light emitting element to a current value for checking;
   current controlling means for controlling a current flowing through said light emitting element;
   means for generating a reference signal; and
   detecting means for comparing the electric signal from said light receiving element generated during the flow of said checking current through sad light emitting element with said reference signal and detecting the deterioration of a function of said photo coupler on the basis of the result of said comparison, wherein;
   the checking current set by said current setting means is a predetermined current smaller than a rated current to be supplied to said light emitting element when said photo coupler is normally operated.

2. A diagnosis apparatus for a photo coupler according to claim 1, wherein said detecting means includes signal means for generating a deterioration signal when said electric signal is smaller than said reference signal, and indicating means connected to said signal means for indicating the presence of the deterioration of said photo coupler on the basis of the deterioration signal.

3. A diagnosis apparatus for a photo coupler according to claim 1, wherein a plurality of photo couplers are provided, the light emitting elements in said photo couplers are connected in series with or in parallel to each other, and said current controlling means controls currents flowing through each of said light emitting elements.

4. A diagnosis apparatus for a photo coupler according to claim 3, wherein said detecting means includes a plurality of means for independently comparing electric signals from each of said light receiving elements with said reference signal and for generating a deterioration signal when one of the electric signals is smaller than said reference signal, and means for indicating the presence of the deterioration of a photo coupler on the basis of the deterioration signals from said plurality of deterioration signal generating means.

5. A diagnosis apparatus according to claim 4, wherein said detecting means further includes means for identifying the deteriorated photo coupler on the basis of the deterioration signals from said plurality of deterioration signal generating means.

6. A diagnosis apparatus for a photo coupler according to claim 5, wherein said indicating means includes display means for displaying in an identified manner the deteriorated photo coupler identified by said deteriorated photo coupler identifying means.

7. A photo coupler device with a diagnosis function comprising:
  at least one photo coupler including a light emitting element, the amount of light emitted from which changes in accordance with the value of a current flowing therethrough, a light receiving element which receives the light from said light emitting element and converts it into an electric signal corresponding to the received amount of light, and a detector member which obstructs the light from sad light emitting element in proceeding to said light receiving element;
  means for generating a reference signal;
  comparing means for comparing the electric signal from said light receiving element with said reference signal to detect whether or not said detector member is in a position at which said detector member obstructs the light from said light emitting element in proceeding to said light receiving element, thereby generating a detection signal
  current setting means for setting the value of a current to be supplied to said light emitting element;
  current controlling means for controlling a current flowing through said light emitting element; and
  detecting means for detecting the deterioration of a function of said photo coupler on the basis of the current value set by said current setting means and the detection signal from said comparing means, wherein;
  said current setting means allows the setting to a rated current which flows through said light emitting element in a state in which said photo coupler is normally used and to at least one checking current value which is used for checking the deterioration of said photo coupler and is smaller than said rated current.

8. A photo coupler device with diagnosis function according to claim 7, wherein a plurality of photo couplers are provided and said current controlling means simultaneously supplies the light emitting elements in said plurality of photo couplers.

9. A photo coupler device with diagnosis function according to claim 7, further comprising means for bringing said detector member into a position at which the light from said light emitting element is sent to said light receiving element, prior to the checking of the deterioration of said photo coupler.

10. A photo coupler device with diagnosis function according to claim 7, wherein said current controlling means includes a first circuit having a first switching element by which a first current is supplied to said light emitting element and a second circuit for supplying a second current to said light emitting element.

11. A photo coupler device with diagnosis function according to claim 10, wherein said current setting means includes means for turning said first switching element on and off.

12. A photo coupler device with diagnosis function according to claim 10, wherein said first circuit is a circuit for supplying said rated current and said second circuit is a circuit for supplying said checking current.

13. A photo coupler device with diagnosis function according to claim 10, wherein said second circuit has a second switching element for passing and cutting off a current flowing through said second circuit.

14. A photo coupler device with diagnosis function according to claim 13, wherein said current setting means includes means for turning said first and second switching elements on and off.

15. A photo coupler device with diagnosis function according to claim 13, wherein said current setting means includes first means for simultaneously turning said first and second switching elements on to supply said rated current to said light emitting element, second means for turning said first switching element on to supply a first checking current to said light emitting element, third means for turning said second switching element on to supply a second checking current to said light emitting element, and fourth means for simultaneously turning said first and second switching elements off so that essentially no current flows through said light emitting element.

16. A diagnosis apparatus for detecting an unacceptable operating condition of a photo coupler including a light emitting element for emitting a quantity of light proportional to the value of a current flowing therethrough and a light receiving element which receives said quantity of light and converts it into an electric signal corresponding to said received quantity of light, the diagnosis apparatus comprising:
  means for generating a reference signal; and
  first current setting means for setting a current flowing through said light emitting element to a current value for rated operation;
  second current setting means for setting a current flowing through said light emitting element to a current value for checking less than said rated current value, each of said current values being sufficient to cause said light emitting element to provide a sufficient quantity of light to allow said light receiving element to generate an electric signal greater than said reference signal under acceptable operating conditions;

current controlling means for controlling a current flowing through said light emitting element by switching between said first and second current setting means; and detecting means for comparing the electric signal from said light receiving element generated during the flow of said checking current through said light emitting element, with said reference signal and detecting the deterioration of a function of said photo coupler to an unacceptable level, on the basis of the result of said comparison.

* * * * *